United States Patent [19]
Blanchard

[11] Patent Number: 5,663,079
[45] Date of Patent: Sep. 2, 1997

[54] METHOD OF MAKING INCREASED DENSITY MOS-GATED SEMICONDUCTOR DEVICES

[75] Inventor: Richard A. Blanchard, Los Altos, Calif.

[73] Assignee: Calogic Corporation, Fremont, Calif.

[21] Appl. No.: 463,169

[22] Filed: Jun. 5, 1995

Related U.S. Application Data

[63] Continuation of Ser. No. 409,615, Mar. 22, 1995, Pat. No. 5,528,063, which is a continuation of Ser. No. 151,336, Nov. 12, 1993, abandoned.

[51] Int. Cl.⁶ .................... H01L 21/265; H01L 21/225
[52] U.S. Cl. .................... 438/138; 438/268; 438/532; 438/586
[58] Field of Search ............... 437/40 DM, 41 DM, 437/29, 162, 28

[56] References Cited

U.S. PATENT DOCUMENTS

| | | | |
|---|---|---|---|
| 4,375,717 | 3/1983 | Tommel | 29/571 |
| 4,417,385 | 11/1983 | Temple | 29/571 |
| 4,598,461 | 7/1986 | Love | 29/571 |
| 4,682,405 | 7/1987 | Blanchard | 29/571 |
| 4,920,064 | 4/1990 | Whight | 437/41 |
| 4,939,100 | 7/1990 | Jeuch et al. | 437/44 |
| 5,049,519 | 9/1991 | Teng | 437/68 |
| 5,285,094 | 2/1994 | Mori et al. | 257/341 |
| 5,318,663 | 6/1994 | Buti et al. | 437/68 |
| 5,466,616 | 11/1995 | Yang | 437/41 |

FOREIGN PATENT DOCUMENTS

| | | | |
|---|---|---|---|
| 53-121580 | 10/1978 | Japan | 437/162 |
| 63-260081 | 10/1988 | Japan | 257/342 |

*Primary Examiner*—John Niebling
*Assistant Examiner*—Michael S. Lebentritt
*Attorney, Agent, or Firm*—Skjerven, Morrill, MacPherson, Franklin, & Friel; Norman R. Klivans

[57] ABSTRACT

In a method of fabricating semiconductor devices such as transistors and in the devices formed thereby, a doped polysilicon layer is formed overlying an insulated gate. The doped polysilicon layer extends over the top and the sidewalls of the gate to contact the underlying substrate. The dopants implanted in the polysilicon layer are diffused into the underlying substrate to form the source region in a self-aligned process which requires no extra masking step. The doped polysilicon layer, by contacting the source region and also overlying the gate, allows external electrical contact to be made on the top of the gate to the source regions, eliminating the need for a special source contact adjacent to the gate. This conserves surface area of the device, allowing fabrication of a smaller and hence more economical device.

6 Claims, 14 Drawing Sheets

METHOD OF MAKING INCREASED DENSITY MOS-GATED SEMICONDUCTOR DEVICES

CROSS REFERENCE TO RELATED APPLICATIONS

This application is a continuation of application Ser. No. 08/409,615, filed Mar. 22, 1995, now U.S. Pat. No. 5,528,063 which is a continuation of application Ser. No. 08/151,336, filed Nov. 12, 1993, now abandoned.

BACKGROUND OF THE INVENTION

1. Field of the Invention

This invention relates to MOS-gated double-diffused semiconductor devices. Such devices include lateral and vertical DMOS transistors, IGBTs, MOS-controlled thyristors (MCT's) and any Mos-geated Mos-controlled device formed using DMOS technology, whether as a discrete device, or as a device incorporated in an integrated circuit. More specifically, the invention relates to a method of fabricating such devices using two layers of polysilicon, one layer of which is the gate electrode and a second layer overlying and insulated from the gate electrode which second layer serves as a source of dopant for one or more of the device regions and also serves as an electrical contact to that (those) region(s). In addition, components such as resistors, capacitors, diodes, and thin film transistors can be simultaneously fabricated using this second layer of polysilicon.

2. Description of the Prior Art

DMOS (double-diffused MOS) devices using gate electrodes of polysilicon (polycrystalline silicon) are well known in the art and are conventionally fabricated using multiple cells or repetitive interdigitated structures on a die by forming various layers (see FIG. 1) in and on an epitaxial (epi) layer 6 which is doped N− and formed on a silicon crystal substrate 8 doped N+. Typically, a polysilicon (polycrystalline silicon) gate layer 10 is formed on an underlying gate oxide layer 12 to serve as a gate electrode. (All figures in this disclosure are cross-sectional views of a portion of a semiconductor wafer or die). Source regions 14 and a body region 16 (including a P+ body region 18) are diffused into epi layer 6. P+ body region 18 is shown in FIG. 1 as being both more heavily doped than the P-type body region and deeper than the body region. Region 18 only needs to be more heavily doped than the body region; it does not need to be deeper. Source 14 and body 16 regions are then both electrically contacted by depositing conductive material 20 in the area between gates of adjacent cell. Also, a conductive drain contact 22 is established on the underside of the substrate 8 (or on the top surface of the device if it is in an integrated circuit.)

In this structure disadvantageously the area devoted to the source and body contact 20 between gates 10 requires a certain amount of surface area on the epi layer 6 so as to be properly spaced from the gates 10. This is shown by the conventional contact alignment tolerance "d". Thus these devices have larger surface area than is otherwise necessary. It is well known that for such devices manufacturing cost is a function of surface area. Thus it is desirable to have a more compact power device structure than is available in the prior art by reducing the surface area devoted to the source contact regions.

SUMMARY OF THE INVENTION

In accordance with the invention, a power MOSFET or other MOS-gated device is conventionally fabricated up to the step of forming and insulating the gate electrodes on the substrate. Then a second layer of polysilicon is formed over the gate electrodes and doped. The second polysilicon layer is then used to dope the source region (or the source and body region) in the portion of the substrate immediately under and in contact with the second polysilicon layer. The second polysilicon layer need only be doped in the regions above and adjacent to the source or the source and body regions. Other regions of this polysilicon layer can remain undoped, or may be doped differently to form other devices. The second layer of polysilicon thus serves as an electrical contact to the underlying source or to the source and body regions and also as a self-aligned mask to form the semiconductor deep body region in the substrate between adjacent gates. The drain contact is conventionally made to the underside of the substrate.

Advantageously, the need for source contact regions located entirely between adjacent gates is eliminated, because the source (or source and body) contacts are instead made to the second layer of polysilicon which is electrically shorted to the source or source and body, and located on top of the gate electrodes. Also advantageously, the conventional contact alignment region at the edge of each gate is eliminated by the self alignment process. In one embodiment, for each of the hundreds of transistors formed on one die, each transistor is smaller (increased in "density") by approximately 4 microns both in width and length compared to prior art power transistors. This saves approximately 10% in terms of device area over the prior art for high voltage devices (greater than or equal to 350 V) and approximately 20% for low voltage (less than or equal to 100 V) devices.

The method of fabrication in accordance with the invention is compatible with both cellular (closed) and interdigitated (open) device topside geometries.

BRIEF DESCRIPTION OF THE DRAWINGS

Similar reference numbers in various figures denote similar or identical structures.

DETAILED DESCRIPTION OF THE INVENTION

Figure 1:
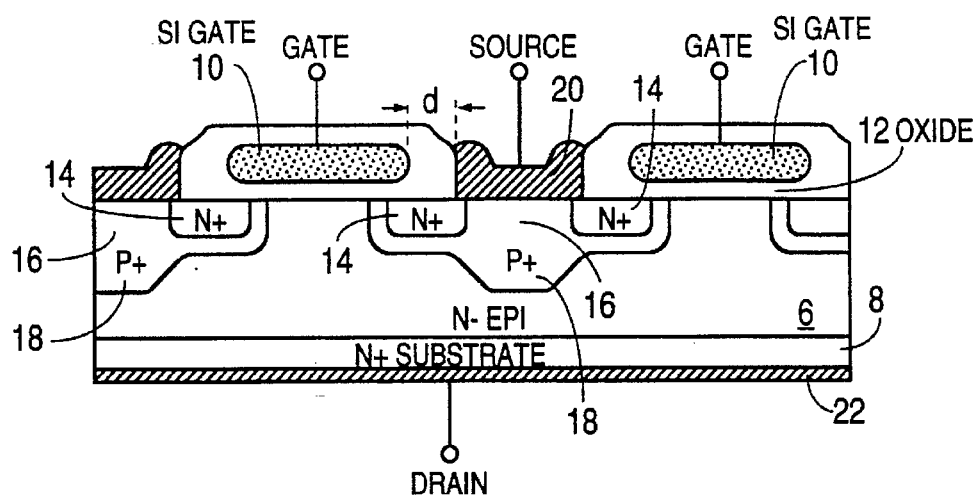
FIG. 1 shows a prior art MOSFET.
Figure 2:
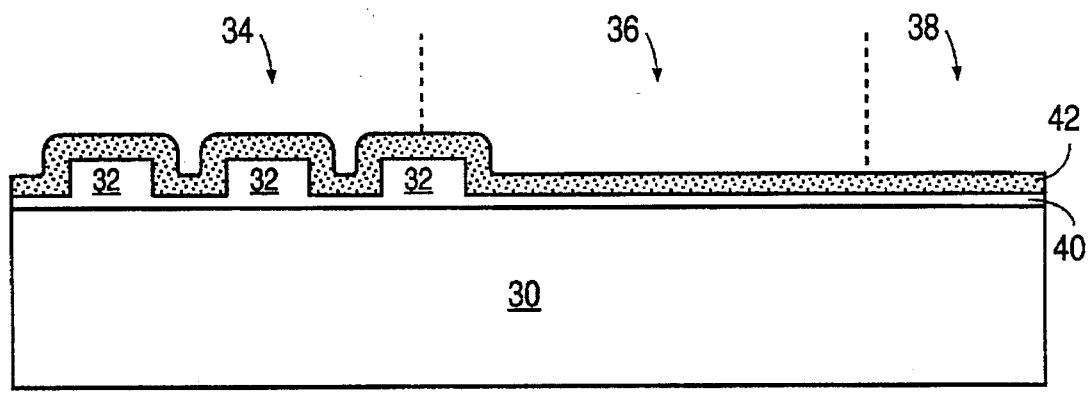
FIGS. 2–5 show process steps for forming a transistor cell.

FIGS. 2–5 show one sequence of process steps for forming a device cell or region along with the edge termination and a bonding pad area in accordance with the invention. It is understood that typically hundreds of such interconnected cells or regions are formed on one semiconductor die, and many such die are formed on one wafer. As shown in FIG. 2, a conventional single crystal silicon substrate (not shown) is provided and an epi layer 30 about 6 to 100 microns thick grown thereon. This substrate is typically a silicon wafer as conventionally used in semiconductor processing. A layer of silicon dioxide 32 is conventionally grown on the epi layer 30 principal surface by high temperature thermal oxidation. Oxide layer 32 is typically approximately 0.4 to 1.0 microns thick. Then a conventional photoresist mask layer (not shown) is deposited over the oxide and conventionally exposed and patterned. Then oxide layer 32 is etched to form three device regions 34, 36, 38 which are the termination 34, the current conducting (cell) region 36, and the wire bonding regions 38 of the transistor. Then a gate oxide layer 40 is grown to a thickness of approximately 0.05 to 0.10 microns thereover.

The a layer of polycrystalline silicon 42 (polysilicon) is conventionally deposited by chemical vapor deposition (CVD). Polycrystalline silicon layer 42 is the first so-called "poly" layer and is the gate electrode layer and is approximately 0.4 to 0.7 microns thick. This first polysilicon layer 42 is then doped conventionally using a thermal predeposition or ion implantation With N type dopant material such as arsenic or phosphorus. The level of doping is approximately $10^{19}$ to $10^{21}$ atoms/cm$^3$. (It is to be understood that the gate electrode need not be polysilicon, but may be other conductive material).

Figure 3:
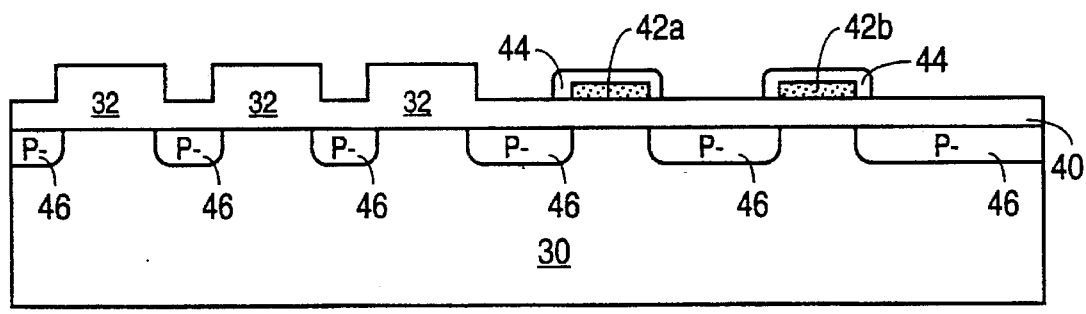

Then in FIG. 3, the first polysilicon layer 42 has a photoresist layer (not shown) formed over it which is conventionally exposed and patterned. Portions of first polysilicon layer 42 are removed by etching, leaving the two polysilicon layer structures 42a, 42b which serve as gate electrodes for adjacent transistors. The first polysilicon layer 42a, 42b is then thermally oxidized 44 to a thickness of approximately 0.1 to 0.6 microns. Then a conventional boron implant forms the P– regions 46 in the semiconductor substrate. As shown, the termination oxide structures 32 and the first polysilicon gate layer 42a, 42b act as a mask to define where the P– regions 46 are formed. These P– regions 46 are formed by the implantation and a subsequent diffusion; a typical dose level for the boron implant is $1\times10^{13}$ to $5\times10^{14}$/cm$^2$. Up to this point, all of the steps have been conventional.

Figure 4:
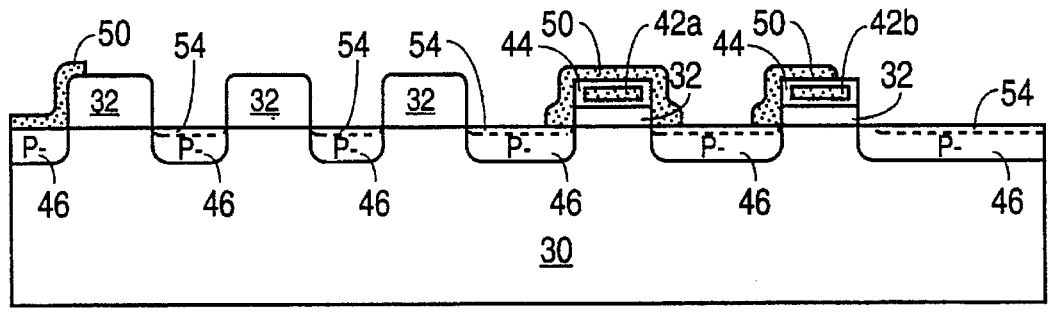

As shown in FIG. 4, the gate oxide layer 44 is then removed by plasma or wet etching except where it is overlain by gate electrodes 42a, 42b. Then a second polysilicon layer 50 is deposited by CVD over the entire structure to a thickness of approximately 0.3 to 0.7 microns. This second polysilicon layer 50 is then doped using an N type dopant (arsenic or phosphorus) using thermal predeposition or ion implantation at a dose of approximately 1 to $10\times10^{15}$/cm$^2$. The second polysilicon layer 50 is then covered with a photoresist masking layer (not shown) which is conventionally patterned, and all of the second polysilicon layer 50 removed by etching except those portions shown covering one gate structure 42a and a portion of the second gate structure 42b and a portion of one of the termination structures 32. The layer of photoresist which forms the mask for patterning the second polysilicon layer remains. In the steps of masking and etching the second polysilicon layer 50, the etching step includes etching any N+ "skin" 54 formed by diffusion of N-type dopant from the polysilicon layer 50 into the underlying single crystal silicon P– region 46 where the second polysilicon layer 50 was deposited.

Figure 5:
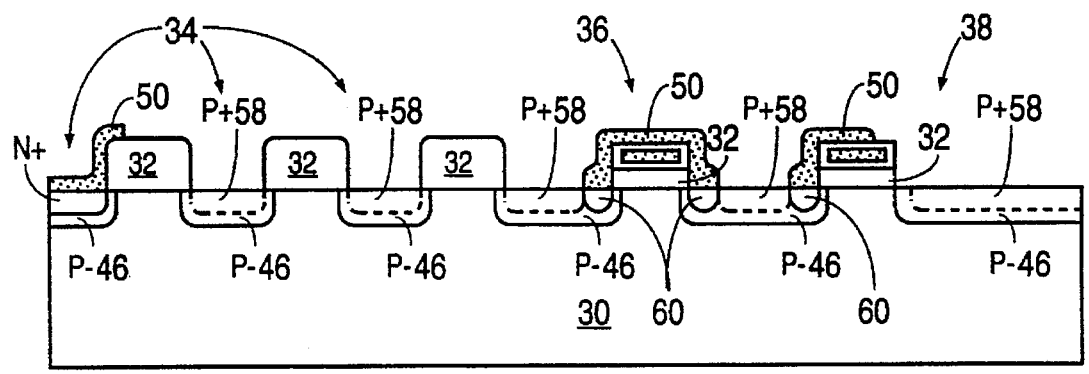

In FIG. 5, next is an implantation of P+ regions 58 which form the deep body regions of the transistors and also define pad region 38 for subsequent wire bonding (at the right side of the drawing) and form field limiting rings 34 in the termination portion (left side) of the cell. Then in a single conventional diffusion step, implanted P+ regions 58 are diffused and also the N type dopant in the second polysilicon layer 50 diffuses into the epi layer 30. The resulting N+ regions 60 are the source regions of the transistors. It is understood that the two leftmost source regions 60 in FIG. 5 are really one annular region (for a closed cell transistor), joined outside the plane of the drawing. In an interdigitated structure the source regions 60 are parallel in a top view.

Thus the N+ source region (s) 60 are self-aligned to the P– body region (s) 46 by the second polysilicon layer 50. Also, the P+ body regions 58 and the N+ source region (s) 60 are self aligned by the second polysilicon layer 50. This structure advantageously eliminates any need to form a contact region to the source regions 60 which would have to be offset from the edge of the gate electrodes 42a, 42b. Thus the overall size of the cell (the gate-to-gate distance) is reduced. That is, the source region contact alignment areas normally provided at the edge of the gate electrode 42a, 42b are eliminated, because the only external contact to the source region 60 is the second polysilicon layer 50 which is directly over the insulated gate electrode 42a, 42b and over the N+ doped source regions 60.

Using this technique, the overall width of the cell can be considerably reduced over that of the prior art, especially for the spacing between adjacent gate electrodes. Limiting features are the spacing between the source contact area and the gate and the surface area of each source region. The source contact-to-gate spacing must be sufficiently large to prevent electrical contact between these two regions as a result of etching the contact. The source contact area must be large enough to allow a low resistance contact to the source region. It is believed that the optimum (minimum) width for a contact to the source region is approximately 1 to 2 microns.

In one embodiment, metal (aluminum) which has been deposited over the entire die is conventionally masked and etched to provide source/body and gate contacts on the top surface of the die (not shown). Metal which is left at the edge of the die (in the termination portion 34) electrically connects to the second polysilicon layer 50. A voltage is then applied to short the second polysilicon layer 50 through the N+ source diffusion 60 and the P– diffusion 46 to the lightly doped drain region (not shown) at the perimeter of the die.

The edge termination region of the die is formed in the same process steps as is the active cell. The termination region includes field limiting rings 34. Also as shown, a source pad 38 is provided adjacent to the active cell 36. These structures are thereby formed without any extra masking steps.

Figure 6:
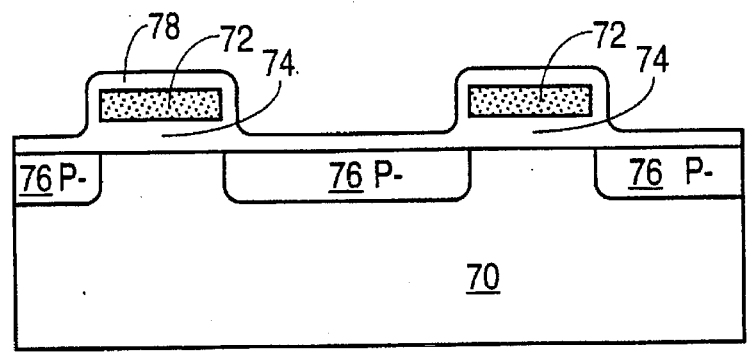
FIGS. 6–10 show another set of steps for forming another type of transistor cell.

Another embodiment is shown in FIGS. 6 to 10. In FIG. 6 (corresponding to the process step shown in FIG. 3), the first layer of polysilicon 72 (the gate electrode) is formed over a gate oxide layer 74, and the P– regions 76 are formed in epi layer (substrate) 70 by implantation and diffusion therebetween. A layer of oxide 78 is then formed over the first polysilicon layer 72.

Figure 7:
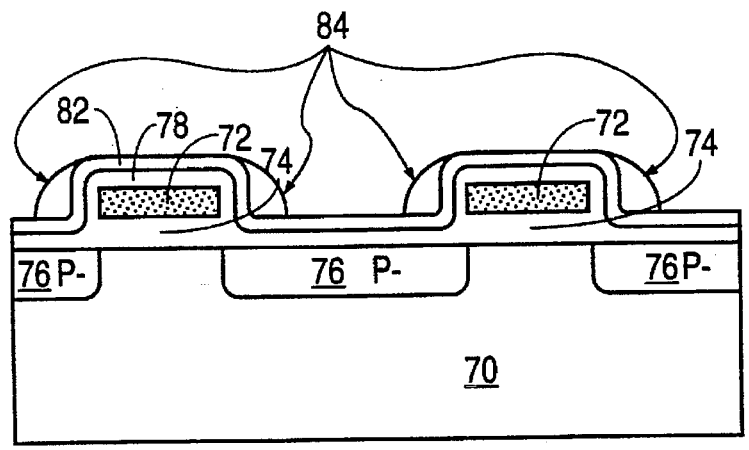

As shown in FIG. 7, a layer of silicon nitride 82 0.1 to 0.4 microns thick is then deposited over this entire structure. Then a low temperature oxide (LTO) layer is deposited over the entire surface to a thickness of 0.5 to 1.5 microns. This LTO layer is then vertically etched using an anisotropic etch to form sidewall spacers 84 on the sides of each gate electrode structure. The sidewall spacers 84 are thus of low temperature oxide formed over the underlying silicon nitride layer 82.

Figure 8:
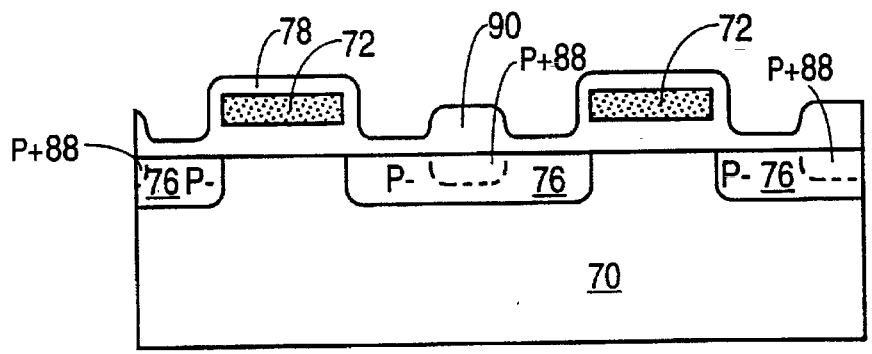

In FIG. 8, silicon nitride layer 82 is then etched to completely remove its exposed portions. The remaining portion of the LTO layer is also etched away, leaving only the silicon nitride sidewall spacers 84. Then a P+ implant is made into the substrate and diffused to form the P+ deep body regions 88. Then a LOCOS (local oxidation of silicon) oxide layer 90 is grown overlying the center of the P– body region 88. Then the residual silicon nitride sidewall spacers 84 are removed by plasma or wet etching.

Figure 9:
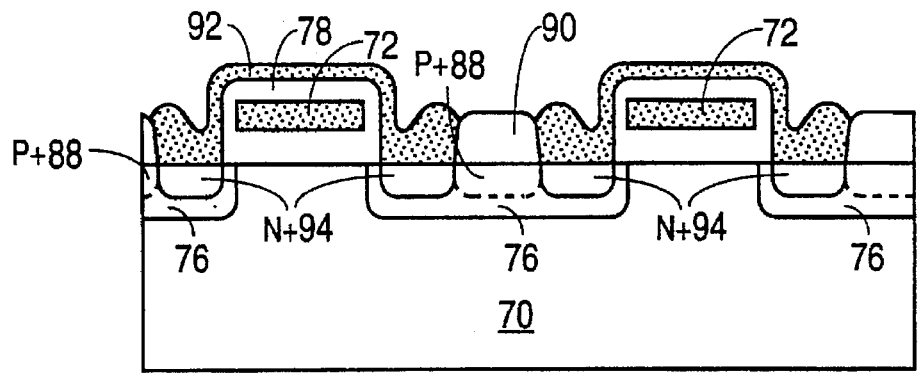

Then in FIG. 9, the overlying silicon dioxide layer 78 is etched away so as to expose portions of the substrate 70 surface over the areas where the source regions are to be formed. Then a second polysilicon layer 92 is deposited over the entire structure. The second polysilicon layer 92 is N+ doped and the N+ dopant then (by diffusion) driven into the silicon substrate to form the source regions 94. The second polysilicon layer 92 may be etched away from over the P+ deep body region 88 either before or after the source doping step, using conventional mask and etch technique.

Figure 10:
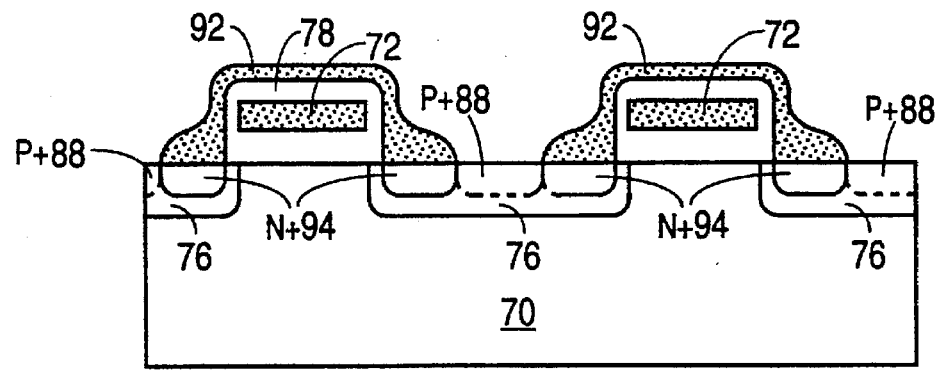

Next in FIG. 10, the LOCOS layer 90 over the P+ region 88 is etched away. Any silicon dioxide (not shown) over the second layer of polycrystalline silicon 92 is also removed at this time. As shown in FIG. 10, this results in a structure similar to that of FIG. 5 for the active cell region. The termination and pad regions (not shown) are also similar to those of FIG. 5.

An additional advantage of the structures as shown in FIGS. 5 and 10 is that the second polysilicon layer contact to the underlying N+ source region is extremely narrow. Thus the "pinched resistor" formed in the P– body region immediately under the N+ source region is also small, i.e. short, and hence desirably represents a relatively small amount of resistance. In accordance with the invention, this pinched resistor would be perhaps only one-third to one-half the length of that in a conventional transistor. Thus the pinched resistor effect is minimized, which desirably reduces latching.

The above disclosed double polysilicon layer with the intrinsic source contact is not restricted to discrete power MOS transistors. It also applies for instance to MOS-gated discrete or merged transistors or MOS-gated devices in integrated circuits. The ability to contact the source region, the body region, or any other region formed by doping from the second layer of polysilicon provides the advantage that other devices such as IGBTs, MCTs, MOS-gated thyristors, and combination or merged devices, such as current-sensing MOSFETs, can advantageously be fabricated using this technique. Additionally, the technique may be used to fabricate integrated circuits. In this case the second layer of polysilicon is used for an additional layer of interconnect, or for forming passive devices such as resistors or capacitors, or for forming diodes and isolated MOS transistors, in addition to being used to dope and to electrically contact regions of the MOS-gated devices.

The capability to dope the source region using a second polysilicon layer as a doping medium also means that it is possible to contact the body and source regions separately without a significant area penalty ( i.e., without providing contact alignment regions therebetween). In some applications, it may be advantageous to have separate source and body contacts such as in MOSFETs and IGBTs and in other MOS-gated devices with four or more separate regions (gate, body, source, and drain).

Where separate contact to the source and body region is desired, or where it is desirable to contact the source region remote from the body region (for instance, to include additional resistance in series with the source), the following sequence is used.

Figure 11:
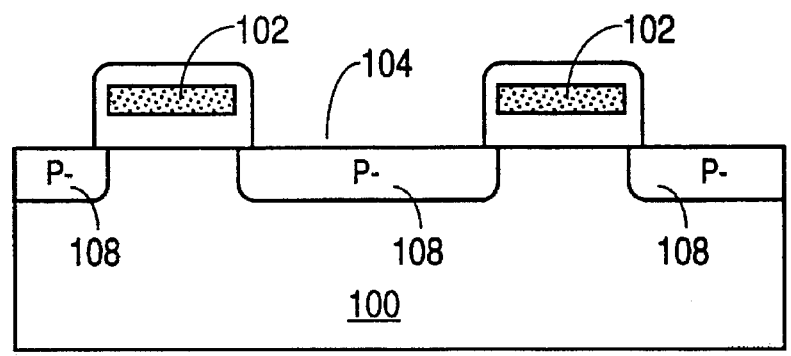
FIGS. 11–16 show another set of process steps for forming separate source and body contacts.
Figure 12:
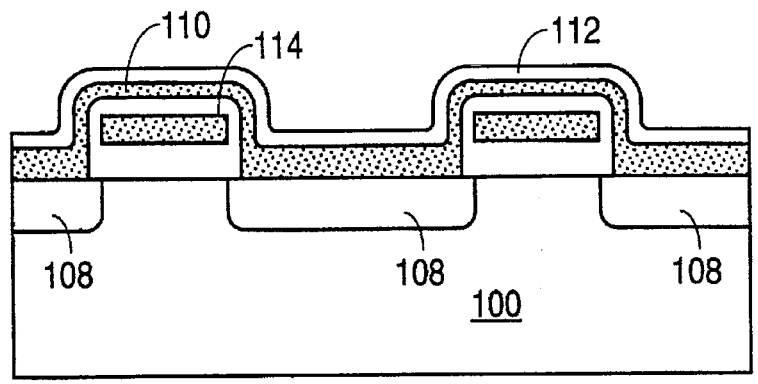
Figure 13:
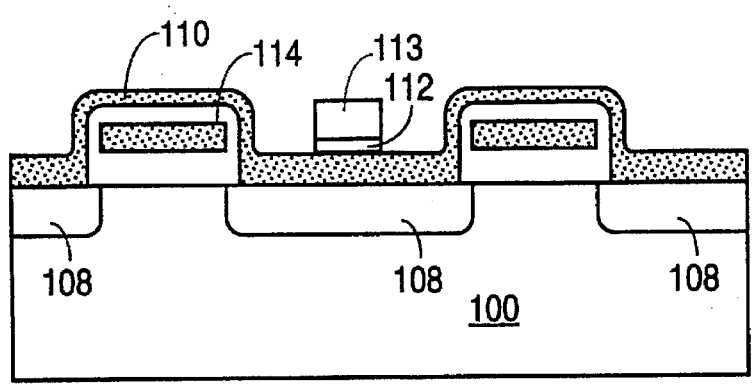

First the gate regions 102 are conventionally formed on gate oxide layer 104, and the P– body regions 108 are diffused into the epi layer (or substrate) 100, as shown in FIG. 11. (At this process step, the structure is identical to that of FIG. 6.) Next in FIG. 12, the second layer of polycrystalline silicon 110 and a subsequent layer of silicon nitride 112 are deposited over upper oxide layer 114. The layer of silicon nitride 112 is masked with photoresist mask layer 113 and etched, leaving the silicon nitride mask 112 only where later contact to the body regions 108 will be made, and the second polysilicon layer 110 is N-type doped using phosphorus as shown in FIG. 13. The region of the polysilicon layer 110 covered by the silicon nitride 112 is not doped.

Figure 14:
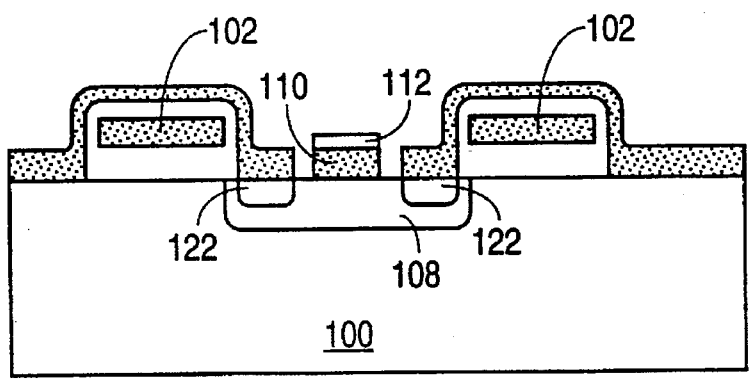
Figure 15:
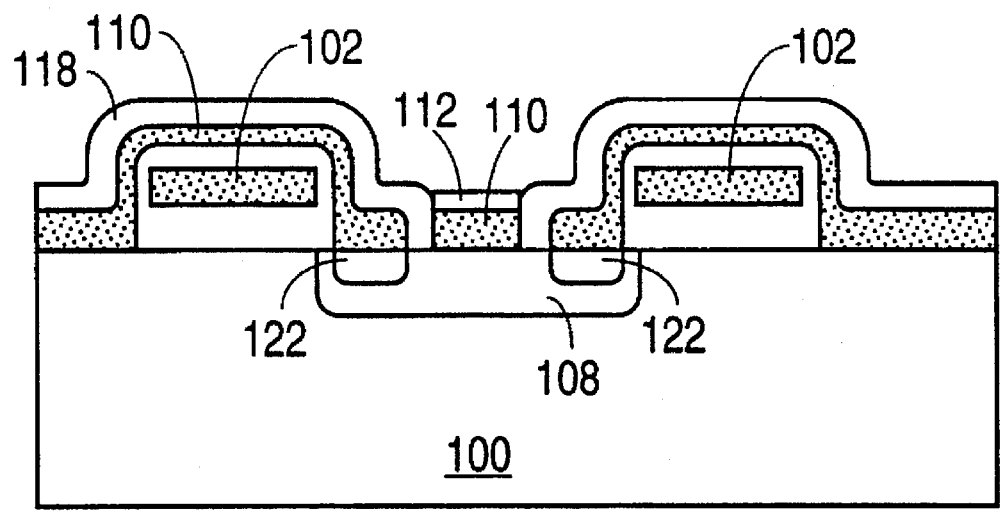
Figure 16:
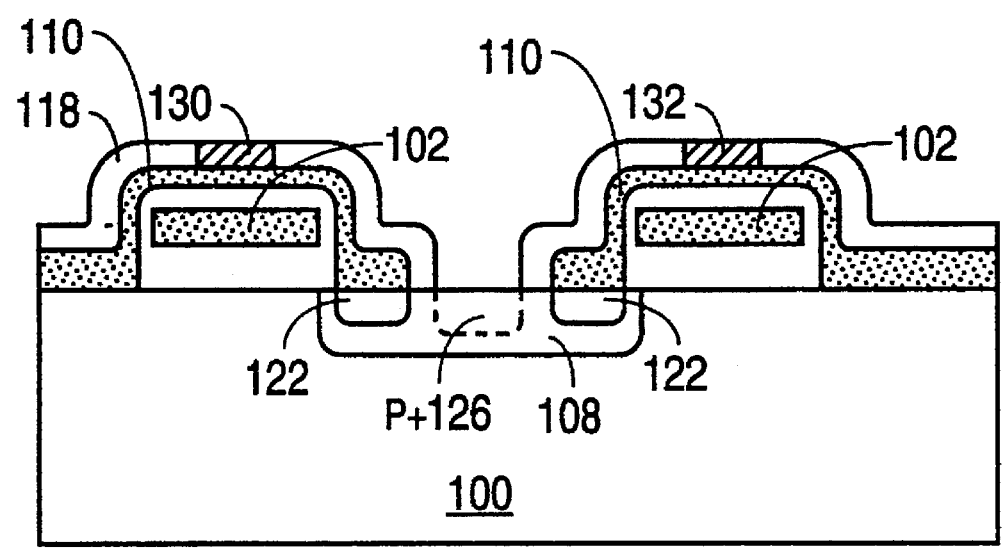

Next, the second layer of polysilicon 110 that surrounds the polysilicon 110 covered by the silicon nitride layer 112 is etched away as shown in FIG. 14, exposing portions of the substrate 100 surface. Thermal oxidation produces a layer of silicon dioxide 118 on the polysilicon 110 and on any exposed part of the silicon substrate 100, as shown in FIG. 15. During this high temperature step, the N-type dopant in the second polysilicon layer 110 that is not beneath the silicon nitride layer 112 forms the diffused N type source regions 122. Finally, the silicon nitride 112 and polysilicon 110 are removed. P-type dopant is introduced and diffused to the desired depth forming region 126, and separate contact regions 130, 132 are opened to the polysilicon layer to electrically contact the source region 122, as shown in FIG. 16. The remainder of the process is conventional.

The above description is for devices in which only the N+ source regions are doped by the second polysilicon layer. In other embodiments, other regions are doped using the second polysilicon layer, as described hereinafter.

FIGS. 17–22 show sequential steps for three other embodiments. FIGS. 17(a), 18(a), . . . , 22(a) show a first sequential doping process. FIGS. 17(b), 18(b), . . . , 21(b) show a second sequential doping process. FIGS. 17(c), 18(c), . . . , 21(c) show a simultaneous doping process. In each of these three separate processes, the P– body region and also the N+ source region are doped using the second polysilicon layer as a dopant source. This process of doping the P– body region and the N+ source region may be sequential as in the first (a) or second (b) process sequences shown, or may be simultaneous as shown in the third (c) process sequence shown. The relative diffusion coefficients of the P-type dopant (typically boron) and the N-type dopant (typically arsenic or phosphorus) are accounted for in these process sequences. Boron and phosphorus diffuse at approximately the same rate, and would most likely be used for sequences (a) and(b). Arsenic diffuses more slowly than boron, and would be used in sequence (c).

Figure 17A:
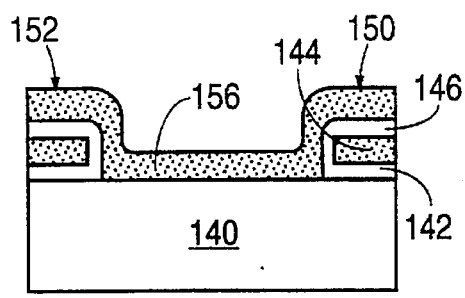
FIGS. 17(a) to 17(c), 18(a) to 18(c), 19(a) to 19(c), 20(a) to 20(c), 21(a) to 21(c), and 22(a) show other sets of process steps for forming transistor cells.

As shown in FIG. 17(a), starting conventionally with the silicon crystal substrate 140, a layer 142 of gate oxide is formed. Then a first layer 144 of polysilicon (the gate conductor) is formed and overlain by a topside oxide insulating layer 146. These layers are then masked and etched to form the two gate structures 150, 152. Then a second polysilicon layer 156 is formed over the entire structure. The second polysilicon layer 156 is then doped with P type dopant.

Figure 17B:
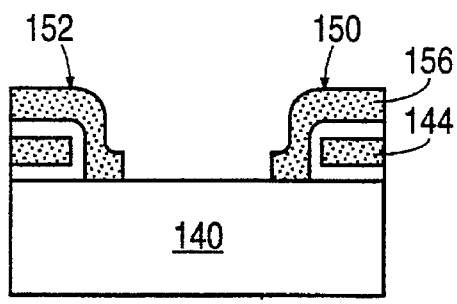

As shown in the sequence beginning with FIG. 17(b), the gate structures 150, 152 are similarly formed and covered with the second polysilicon layer 156 which is then masked and etched to expose a portion of the substrate 140. As shown in the sequence beginning with FIG. 17(c) for the simultaneous type doping process, the same structure is formed by the same steps as in FIG. 17(a).

Figure 18A:
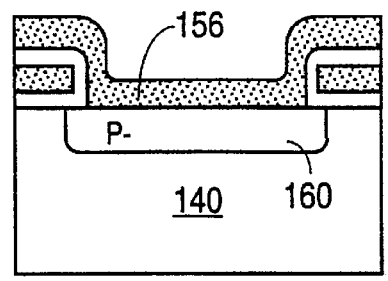
Figure 18B:
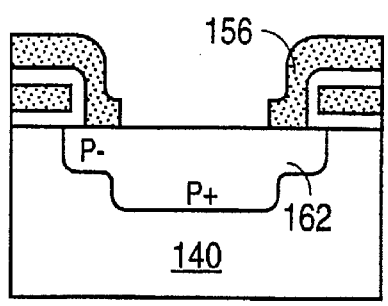
Figure 19B:
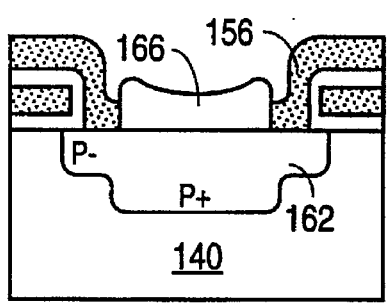
Figure 18C:
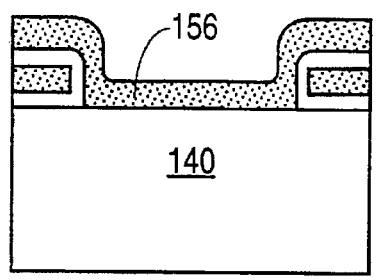

Then as shown in FIG. 18(a), the P type dopant present in the second polysilicon layer 156 is conventionally diffused into the silicon substrate 140, forming P– body region 160. In FIG. 18(b), the P type implant is made and driven in (diffused). However in this case the resulting P– region 162 has a different cross-sectional profile because the second polysilicon layer 156 previously has been partially etched away. In FIG. 18(c), a second dopant which in this case is an N type dopant (arsenic or phosphorus) is implanted into the second polysilicon layer 156 with no diffusion step at this point.

Figure 19A:
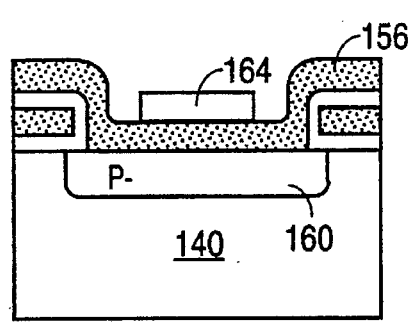
Figure 19C:
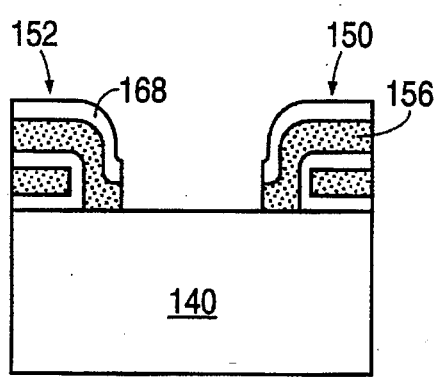
Figure 20C:
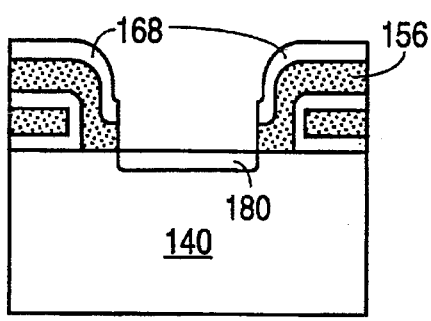
Figure 21C:
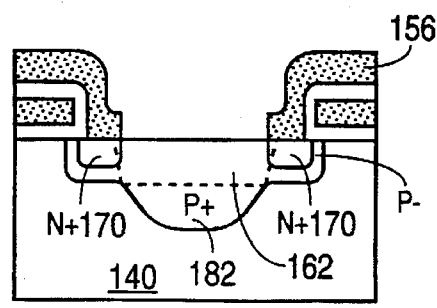

Then in FIG. 19(a), a layer of photoresist 164 is provided over the second polysilicon layer 156, and photoresist layer 164 is masked and patterned. Then an N type dopant is implanted into the second polysilicon layer 156, with the remaining portion of the photoresist layer 164 masking a portion of the underlying second polysilicon layer 156 from this implant step. Similarly in FIG. 19(b), photoresist layer 166 is formed and masked. In this case however the photoresist layer 166 is directly on the silicon substrate 140 surface. The second polysilicon layer 156 is implanted with an N type dopant, with the remaining portion of photoresist layer 166 acting as a mask. As shown in FIG. 19(c), a photoresist layer 168 is formed over the entire structure and then masked and the portion of the photoresist layer 168 on the silicon substrate 140 is removed, leaving the photoresist layer 168 only over the gate structures 150, 152. As shown in FIG. 19(c), the second polysilicon layer 156 is thus masked and etched away in the central portion between the two gate structures 150, 152.

Figure 20A:
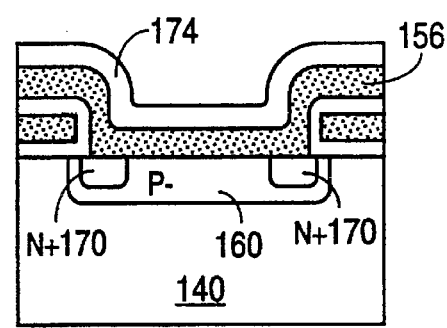
Figure 20B:
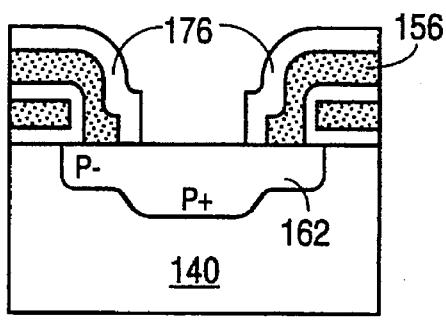
Figure 21B:
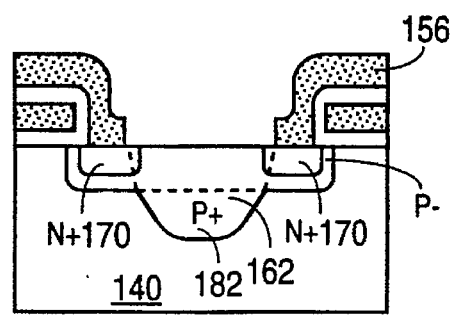
Figure 17C:
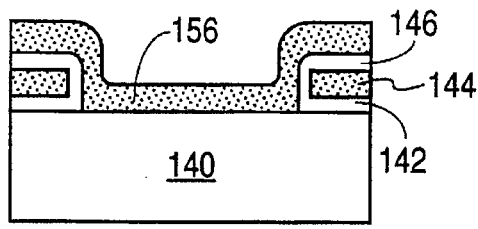

As shown then in FIG. 20(a), a diffusion step diffuses the N type dopant present in the second polysilicon layer 156 into the substrate 140, to form the source region(s) 170 which are thereby doped N+. The second polysilicon layer 156 is then oxidized to form an overlying oxide layer 174. FIG. 20(b) shows the corresponding step for the second sequential doping process; here another photoresist mask layer 176 is formed which is exposed and portions of which are removed including the earlier photoresist layer 166 in the central part of the structure. Photoresist layer 176 is a mask for a subsequent P type dopant implanted into the central portion of the substrate. In the corresponding step in the simultaneous doping process in FIG. 20(c), using the mask layer 168 formed in FIG. 19(c), a P+ dopant is implanted into the substrate 143, forming shallow P+ region 180.

Figure 21A:
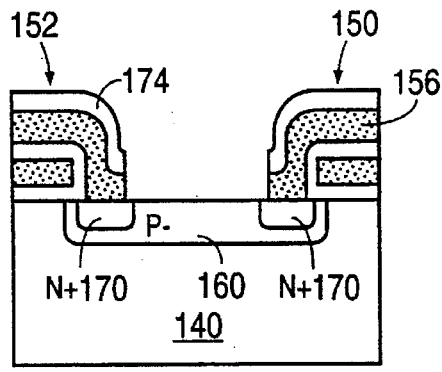

Next in FIG. 21(a), the second polysilicon layer 156 and the overlying oxidized layer 174 are conventionally masked and a portion of both layers is etched away overlying the center portion of the substrate 140 between the two gate structures 150, 152. In the corresponding step in the second sequential diffusion process in FIG. 21(b), the implanted N+ and P+ dopants are driven in (diffused) to form respectively the source 170 and P+ body 182 regions. In the corresponding step in FIG. 21(c) for the simultaneous doping process, all of the previously implanted dopants are diffused into the substrate forming the N+ source region (s) 170, the P– body region 162 and the P+ body region 182. This completes the semiconductor region processing for the second sequential doping process and for the simultaneous doping process.

Figure 22A:
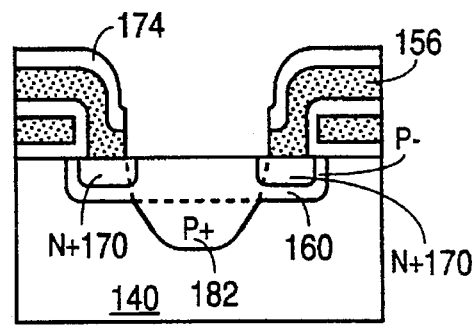

For the first sequential doping process as shown in FIG. 22(a), a P+ implant is made into the semiconductor substrate 140 and this implant is diffused to form the P+ body region 182 which is shown as being deeper than the P– region, but may be shallower than the P– region.

In another embodiment of the invention, all of the doped regions are formed using the second polysilicon layer as a provider of the dopant material. In this embodiment, the polysilicon second layer is not masked and etched, which advantageously reduces the number of process steps needed. This embodiment is described hereinafter using a self aligned LOCOS (local oxidation of silicon) process.

Figure 23:
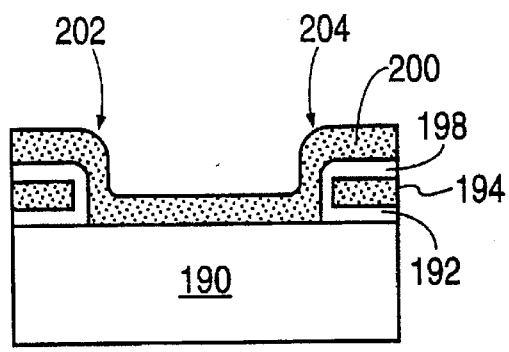
FIGS. 23–28 show another set of steps for forming another type of transistor cell.

As shown in FIG. 23, a gate oxide layer 192 is formed on a silicon substrate 190, followed by a first polysilicon layer 194 which forms the conductive gate electrodes, and an oxidized layer 198 is formed thereover. This structure is then conventionally masked and etched to form gate structures 202, 204. Then a second polysilicon layer 200 is formed over the entire structure and doped with P type dopant material (boron). At this point the P– body diffusion may be performed. However this diffusion step may be postponed until later.

Figure 24:
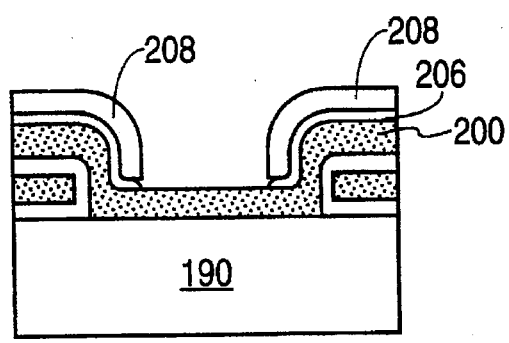

In FIG. 24, a silicon nitride layer 206 is deposited completely over the second polysilicon layer. Silicon nitride layer 206 is then conventionally masked with photoresist layer 208 and etched. The portion of the photoresist layer 208 which remains is shown overlying the remaining portion of the silicon nitride layer 206.

Figure 25:
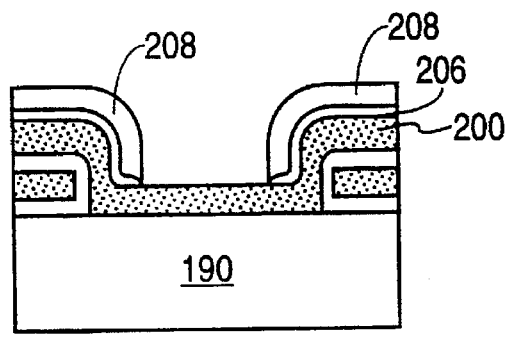

Then in FIG. 25, using the photoresist 208 and nitride layers 206 as masks, a P+ implant (boron) is made into the second polysilicon layer 200 in the center portion of the depicted structure.

Figure 26:
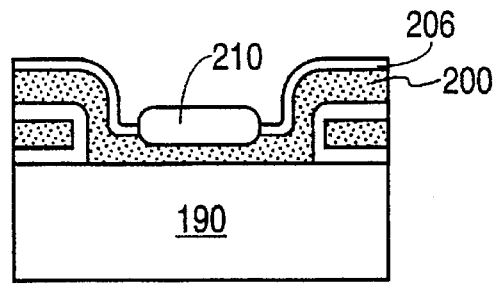

Then in FIG. 26 the photoresist layer 208 is removed and the exposed portion of the second polysilicon layer 200 is oxidized to form a localized relatively thick oxide region (LOCOS) 210.

Figure 27:
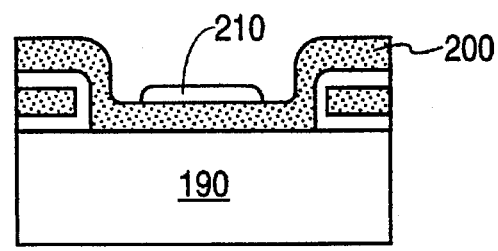

Then in FIG. 27 the remaining portion of the silicon nitride layer 206 is removed and an implant is made of N type dopant (arsenic or phosphorus) into the second polysilicon layer 200. The thick LOCOS oxide region 210 in the center acts as a mask, preventing this N type dopant implant from reaching the underlying portions of the second polysilicon layer 200.

Figure 28:
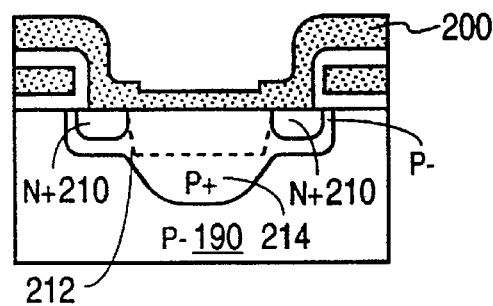

Then in FIG. 28, all of the dopants in the second polysilicon layer 200 are diffused into the semiconductor substrate 190. This forms the N+ source regions(s) 210, the P– body region 212 and the P+ body region 214. Then the LOCOS oxide layer 210 is removed from the surface of the second polysilicon layer 200. Metal (not shown) formed on the second polysilicon layer 200 contacts source 210 and body 212 regions beneath the heavily doped polysilicon layer 200.

In this embodiment, as in the other described embodiments, the device is completed conventionally by providing metallization contacts to the gate conductors and second polysilicon layer, and a passivation and other protective layers forming. Also, electrical contact is made to the substrate underside for a drain contact.

In the above described embodiments, the use of the doped second (upper) polysilicon layer as a diffusion source has the added advantage that it eliminates any implant damage that occurs with conventional dopant techniques. If there is no implant damage, it is also possible to have shallower junctions, and hence devices with smaller lateral dimensions. Also in accordance with the invention, the thickness of the second polysilicon layer used as the diffusion source may be varied. For instance, if a higher resistance is desired in the second polysilicon layer where for instance this layer is acting as a resistor, a thinner layer may be used. In this connection it is noted that the second polysilicon layer may serve as an in-line series resistor to the source and body regions, by adjusting the amount of dopant (conductivity) and the thickness and width of the second polysilicon layer. For instance, by contacting the N+ doped poly at a distance from the source (i.e., over the gate polysilicon) a resistor is added in series with the source.

As is well known, the penetration ranges of boron (the typical P type dopant) and arsenic and phosphorus (the typical N type dopants) differ greatly because of the different atomic weights of these elements. This difference is used to advantage in accordance with the invention by depositing the second polysilicon layer so that it is thick enough to prevent direct penetration of the N type dopant which is intended to form the source, while being too thin to prevent penetration of the P type dopant which forms the body region. The N+ source dopant must then diffuse through the second polysilicon layer to form the source. Thus the amount of dopant in the body and deep body, i.e. P− region and P+ regions, can be precisely controlled. It is also possible to use the LOCOS technique (described above in conjunction with FIGS. 23–28) to control the thickness of the second polysilicon layer overlying the intended location of the P+ deep body region by preferentially oxidizing away part of the polysilicon layer. This partial oxidation and a subsequent etch step achieve the desired differential implant depth effect.

Figure 29:
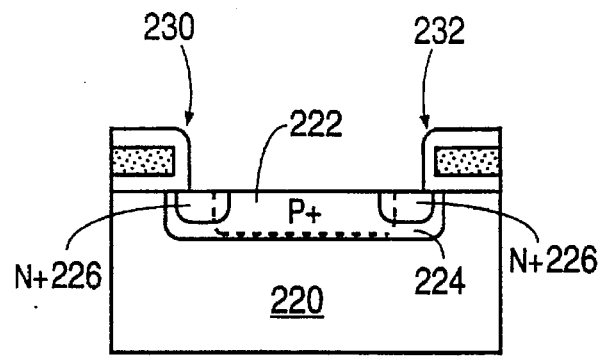
FIG. 29 shows ah alternative technique for forming a body region in accordance with the invention.

The above embodiments each include heavily doped P+ body regions which are deeper than the remainder of the P− body region. Other embodiments need not include this feature. A high performance, rugged power MOSFET or MOS-gated device may be formed using an alternative technique in which the heavily doped P+ body region 222 is actually shallower than the surrounding P− body region 224, as shown in FIG. 29 (which does not show the second polysilicon layer). Also shown are gate structures 230, 232. In this case the P+ region 222 still provides a low resistance path to the portion of the P− body region 224 lying beneath the N+ source regions 226, and also controls the portion of the body region-drain junction where voltage breakdown would occur. This shallow P+ region 222 allows use of a thinner epitaxial layer 220 on the silicon substrate 220, and hence provides lower overall resistance.

Figure 30:
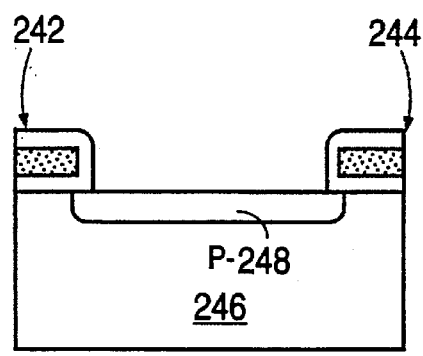
FIGS. 30–34 show another process sequence for forming a cell in accordance with invention.

In another embodiment, described hereinafter with reference to FIGS. 30–34, a P+ body region is self-aligned to the N+ source region. In FIG. 30, after conventionally forming the two gate structures 242, 244 on the semiconductor substrate 246, a P− body region 248 is formed between the two gate structures 242, 244, and the P− body region 248 is diffused only partly to its ultimate depth.

Figure 31:
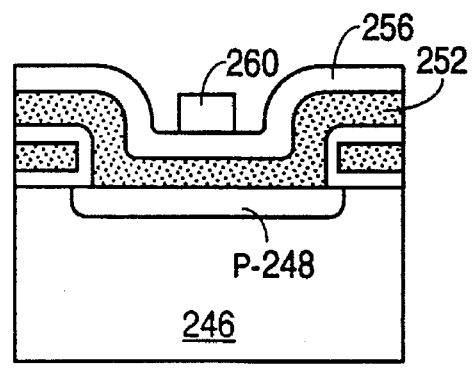

As shown in FIG. 31, a second layer of polysilicon 252 is deposited over the entire structure to a thickness of approximately 0.4 to 0.7 microns, and a thin oxide layer 256 is grown 0.05 to 0.10 microns thick over second polysilicon layer 252. Thin oxide layer 256 prevents doping by phosphorus of the polysilicon layer 252 in these regions. Then the second polysilicon layer 252 is implanted (or otherwise doped) with phosphorus dopant, except in the central region where a masking layer 260 of photoresist has been formed.

Figure 32:
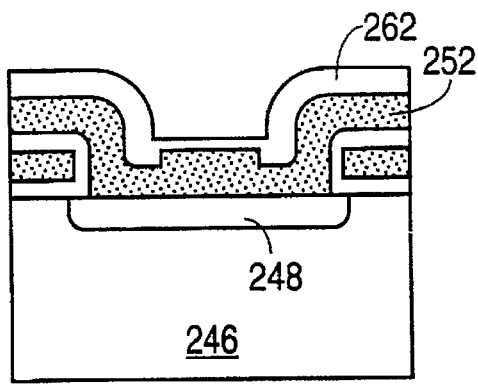

Then in FIG. 32 the masking layer 260 of FIG. 31 is removed and an oxide layer 262 is thermally grown 0.2 to 0.6 microns thick over the second polysilicon layer 252. The regions that have been heavily doped with phosphorus will grow a thicker oxide layer 262 than will the nondoped (central) portions of the polysilicon layer 252.

Figure 33:
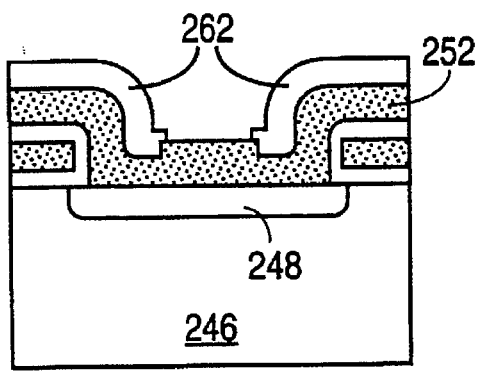

Then in FIG. 33, using a nonpreferential etch method such as wet etching, sufficient of the oxide layer 262 is removed to expose the portion of the underlying second polysilicon layer 252 beneath the thinner portion of the oxide layer 262.

Figure 34:
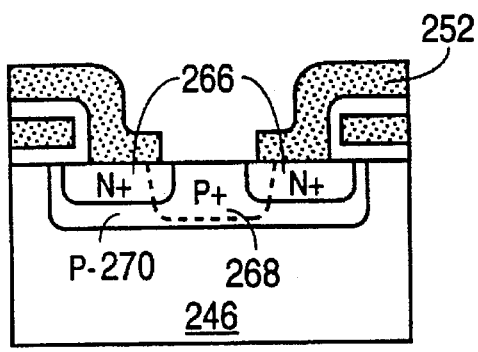

Then in FIG. 34, by conventional polysilicon etching, the exposed portion of the second polysilicon layer 252 is etched away down to the surface of substrate 246. Then, using the remaining portion of the second polysilicon layer 252 as a mask, a P+ implant is made into the silicon substrate 246. Then all of the implanted dopants are diffused, forming the source regions(s) 266, the shallow P+ region 268, and the P− body region 270. A variation of this process sequence uses a layer of silicon nitride instead of silicon dioxide 256 over the second polysilicon layer 252 at FIG. 31. The needed difference in local oxide thickness on the polysilicon layer 272 is obtained by LOCOS.

Figure 35:
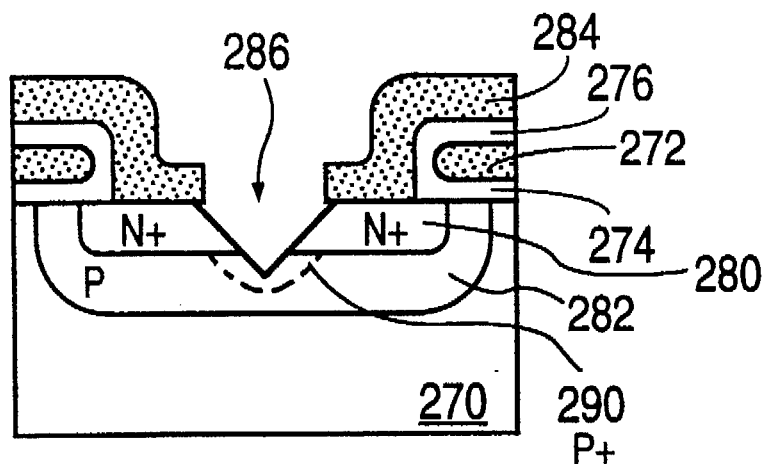
FIGS. 35 and 36 show two other processes for forming a cell in accordance with the invention.

Another embodiment, as described hereinafter with reference to FIGS. 35 and 36, etches a groove into the substrate to remove both part of the substrate and part of the overlying polysilicon layer, then implants a P+ region into the groove walls. In FIG. 35, substrate 270, gate electrode 272, oxide layers 274, 276, doped polysilicon layer 284, source region 280 and body region 282 are formed as described above. Then a preferential etch through polysilicon 284 into substrate 270 defines a V-groove 286. P+ region 290 is then implanted through the groove 286 sidewalls.

Figure 36:
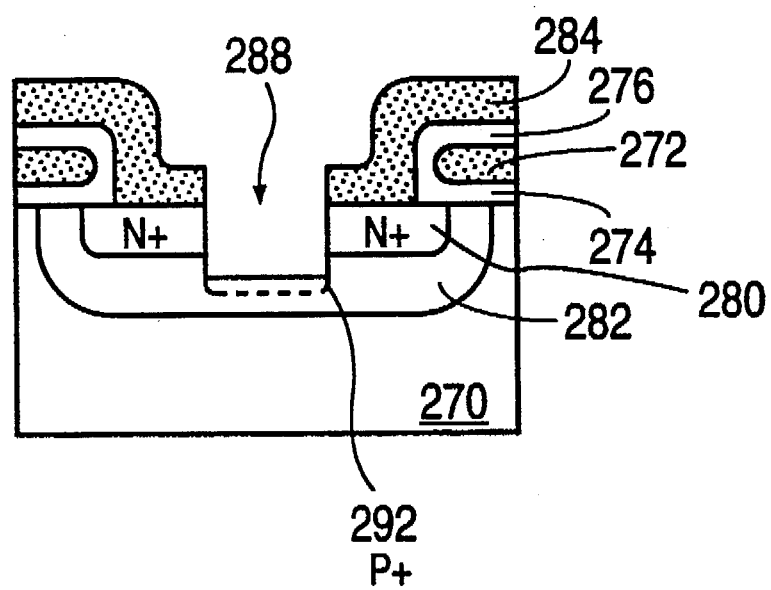

In FIG. 36, the structure and process steps are similar to those of FIG. 35, except that rectangular groove 288 is formed by an isotropic etch, followed by implantation of P+ region 292.

The above descriptions are of N channel devices, i.e. the source region is N type doped. The same techniques may be used for P channel MOS-gated devices by reversing the dopant types in most cases.

Also, the above description is chiefly directed to MOS-gated device cells. The above described methods may also be used in forming other regions of discrete transistors or integrated circuits such as the interconnect regions for both integrated circuits and discrete devices, or high voltage terminations for both integrated circuits and discrete devices. The processing in other regions of the discrete device or integrated circuits is compatible with the above described processing steps.

The above description is illustrative and not limiting. Further embodiments will be apparent in light of this disclosure and are intended to fall within the scope of the appended claims.

I claim:

1. A method of forming a transistor comprising the steps of:

providing a semiconductor body;

forming a gate electrode overlying a portion of a principal surface of said body;

forming a first region of a first conductivity type in said body and extending to said principal surface;

forming an insulating layer overlying at least a portion of a side of said gate electrode and at least a portion of a top surface of said gate electrode;

forming a layer of polycrystalline silicon overlying said insulating layer and contacting said principal surface;

implanting charged ions of a second conductivity type into said layer of polycrystalline silicon; and diffusing a portion of said charged ions into said body at a location wherein said layer of polycrystalline silicon contacts said principal surface, thereby forming a second region of said second conductivity type in said body;

wherein the step of forming said first region comprises the steps of:

implanting ions of said first conductivity type into said layer of polycrystalline silicon; and diffusing said ions into said semiconductor body; and further comprising the steps of:

implanting additional ions of said first conductivity type into only portions of said layer of polycrystalline silicon; and diffusing said additional ions into said semiconductor body.

2. The method of claim 1, wherein said second region is in electrical contact with a portion of said polycrystalline silicon layer overlying said top surface of said gate electrode.

3. The method of claim 1, further comprising the step of forming a third region of said first conductivity type in said substrate and extending to said principal surface, an edge of said third region being aligned to a plane defined by a side of said layer of polycrystalline silicon.

4. The method of claim 1, wherein the step of forming said first region comprises aligning an edge of said first region to a side of said gate electrode.

5. A method of forming a transistor comprising the steps of:

providing a semiconductor body;

forming a gate electrode overlying a portion of a principal surface of said body;

forming a first region of a first conductivity type in said body and extending to said principal surface;

forming an insulating layer overlying at least a portion of a side of said gate electrode and at least a portion of a top surface of said gate electrode;

forming a layer of polycrystalline silicon overlying said insulating layer and contacting said principal surface;

implanting charged ions of a second conductivity type into said layer of polycrystalline silicon; and diffusing a portion of said charged ions into said body at a location wherein said layer of polycrystalline silicon contacts said principal surface, thereby forming a second region of said second conductivity type in said body;

wherein the step of forming said first region comprises aligning an edge of said first region to a side of said gate electrode;

wherein the step of implanting charged ions of a second conductivity type comprises the steps of:

forming a protective layer impervious to said implanting and overlying only a portion of said layer of polycrystalline silicon, prior to said step of implanting; and further comprising the steps of:

removing a portion of said layer of polycrystalline silicon from part of said principal surface after the step of implanting; and implanting charged ions of said first conductivity type into said semiconductor body at said part of said principal surface.

6. The method of claim 1, further comprising the steps of:

forming a groove in said body adjacent said gate electrode; and implanting charged ions of said first conductivity type into side walls of said groove.

* * * * *